(12) United States Patent
Joseph

(10) Patent No.: US 8,848,757 B2
(45) Date of Patent: *Sep. 30, 2014

(54) MULTIBEAM ARRAYS OF OPTOELECTRONIC DEVICES FOR HIGH FREQUENCY OPERATION

(75) Inventor: John Joseph, Carson City, NV (US)

(73) Assignee: Trilumina Corp., Albuquerque, NM (US)

(*) Notice: Subject to any disclaimer, the term of this patent is extended or adjusted under 35 U.S.C. 154(b) by 22 days.

This patent is subject to a terminal disclaimer.

(21) Appl. No.: 13/077,769

(22) Filed: Mar. 31, 2011

(65) Prior Publication Data

US 2011/0176567 A1    Jul. 21, 2011

Related U.S. Application Data

(63) Continuation of application No. 12/707,657, filed on Feb. 17, 2010, now Pat. No. 7,949,024.

(60) Provisional application No. 61/153,190, filed on Feb. 17, 2009.

(51) Int. Cl.
*H01S 5/00* (2006.01)

(52) U.S. Cl.
USPC ..................................... 372/50.12

(58) Field of Classification Search
USPC ........ 372/35, 50.124, 50.12, 45.01, 43.01, 75
See application file for complete search history.

(56) References Cited

U.S. PATENT DOCUMENTS

| | | | |
|---|---|---|---|
| 4,881,237 A | 11/1989 | Donnelly | |
| 4,971,927 A | 11/1990 | Leas | |
| 5,073,041 A | 12/1991 | Rastani | |
| 5,164,949 A | 11/1992 | Ackley et al. | |
| 5,325,386 A | 6/1994 | Jewell et al. | |
| 5,359,618 A | 10/1994 | Lebby et al. | |
| 5,812,571 A | 9/1998 | Peters | |
| 6,044,101 A * | 3/2000 | Luft | 372/46.01 |
| 6,136,623 A | 10/2000 | Hofstetter et al. | |
| 6,608,849 B2 | 8/2003 | Mawst et al. | |
| 6,757,314 B2 * | 6/2004 | Kneissl et al. | 372/50.1 |
| 7,359,420 B2 | 4/2008 | Shchegrov et al. | |
| 2006/0109883 A1 * | 5/2006 | Lewis et al. | 372/50.12 |
| 2008/0205462 A1 * | 8/2008 | Uchida | 372/34 |
| 2008/0273830 A1 * | 11/2008 | Chen et al. | 385/14 |

* cited by examiner

*Primary Examiner* — Jessica T. Stultz
*Assistant Examiner* — Tuan Nguyen
(74) *Attorney, Agent, or Firm* — Baker & Hostetler LLP

(57) ABSTRACT

A VCSEL array device formed of a monolithic array of raised VCSELs on an electrical contact and raised inactive regions connected to the electrical contact. The VCSELs can be spaced symmetrically or asymmetrically, in a manner to improve power or speed, or in phase and in parallel. The VCSELs include an active region positioned between two mirrors generating a pulsed light operating at a frequency of at least 1 GHz. The VCSELs having an output power of at least 120 mW. The raised VCSELs and raised inactive regions are positioned between the electrical contact and an electrical waveguide.

28 Claims, 12 Drawing Sheets

MULTIBEAM ARRAYS OF OPTOELECTRONIC DEVICES FOR HIGH FREQUENCY OPERATION

CROSS-REFERENCES TO RELATED APPLICATIONS

This is a continuation application taking priority from non-provisional application Ser. No. 12/707,657, filed 17 Feb. 2010, which takes priority from provisional application Ser. No. 61/153,190, filed 17 Feb. 2009, each of which are incorporated herein by reference.

BRIEF DESCRIPTION OF THE INVENTION

An embodiment relates to semiconductor devices and, more particularly, to multibeam arrays of photonic devices for high power and high frequency applications, and methods of making and using the same.

An embodiment is directed to a multibeam optoelectronic device, referred to as a VCSEL array device, which has high power and a high frequency response. The VCSEL array device is a monolithic array of VCSELs comprised of two or more VCSELs and an array of short-circuited mesa devices. The VCSELs of the VCSEL array can be spaced symmetrically or asymmetrically, spaced according to a mathematical function for improving a power or speed characteristic, or positioned for phase relationships next to each other in an electrically parallel circuit. The VCSELs of the VCSEL array are electrically connected to a first metal contact pad formed on a heat-spreading substrate or carrier. The array of short-circuited mesa devices is formed alongside the VCSEL array and the devices are bonded to a second metal contact pad on the heat spreading substrate or carrier. These mesa devices form a short circuit from the substrate ground to the second metal contact. Each VCSEL of the VCSEL array is encompassed by a metal heat sink structure, which increases the height of each VCSEL mesa, the heat sink structure and the solder. The relationship between the heat sink structure, the VCSEL array and the mesa device array reduces the parasitic impedance characteristics of the VCSEL array device, thereby increasing its output power and increasing its high frequency response.

The VCSEL array and short-circuit mesa device array can also be positioned to form a coplanar waveguide lead in a ground-signal-ground configuration in the bonded optoelectronic device. This configuration provides superior signal modulation characteristics.

STATEMENTS AS TO THE RIGHTS TO INVENTIONS MADE UNDER FEDERALLY SPONSORED RESEARCH OR DEVELOPMENT

Not applicable.

REFERENCE TO A "SEQUENCE LISTING," A TABLE, OR A COMPUTER PROGRAM LISTING APPENDIX SUBMITTED ON A COMPACT DISK

Not applicable.

BACKGROUND OF THE INVENTION

Semiconductor lasers have gained influence in high power laser applications because of their higher efficiency, advantages in Size, Weight And Power (SWAP) and their lower cost over other forms of high power lasers. Many laser applications such as industrial cutting and welding, Laser Detection and Ranging (LADAR), medical engineering, aviation defense, optically pumping rare earth doped fiber lasers, optically pumping solid state crystals in Diode Pumped Solid State lasers (DPSS), fiber-optic communication, and fusion research, among others, require a high power and high frequency response. Due to their high power array outputs, edge-emitting semiconductor lasers are widely used in such applications. However, degradation of these edge-emitting lasers is common, primarily as a result of Catastrophic Optical Damage (COD) that occurs due to high optical power density at the exposed emission facet.

Vertical-Cavity Surface-Emitting Lasers (VCSELs), in comparison, are not subject to COD because the gain region is embedded in the epitaxial structure and is therefore not exposed to the outside environment. Also, the optical waveguide associated with the edge-emitter junction has a relatively small area, resulting in significantly higher power densities compared to VCSELs. The practical result is that VCSELs can have lower failure rates than typical edge-emitting lasers.

To date, VCSELs have been more commonly used in data and telecommunications applications, which require higher frequency modulation, but not as much power. VCSELs have offered advantages over edge-emitting LASERs in this type of application, including ease of manufacture, higher reliability, and better high frequency modulation characteristics. Arrays of VCSELs can also be manufactured much more cost efficiently than edge-emitting laser arrays. However, with existing VCSEL designs, as the area of the array grows the frequency response has been penalized by heating complexities arising from the multi-element designs, parasitic impedances, and the frequency response of the wire bonds or leads required by the high current. Thus, the modulation frequency of the array decreases.

VCSEL and methods for manufacturing them are known. See, for example, U.S. Pat. Nos. 5,359,618 and 5,164,949, incorporated herein by reference. Forming VCSELs into two-dimensional arrays for data displays is also known. See U.S. Pat. Nos. 5,325,386 and 5,073,041, incorporated herein by reference. Flip-chip multibeam VCSEL arrays for higher output power have been mentioned, in particular, in U.S. Pat. No. 5,812,571, incorporated herein by reference.

However, VCSEL arrays that provide both high frequency modulation and high power have not been adequately developed. Furthermore, arraying such devices together increases heat generation, adding to the negative effects on high frequency operation.

DETAILED DESCRIPTION OF THE INVENTION

Figure 1:
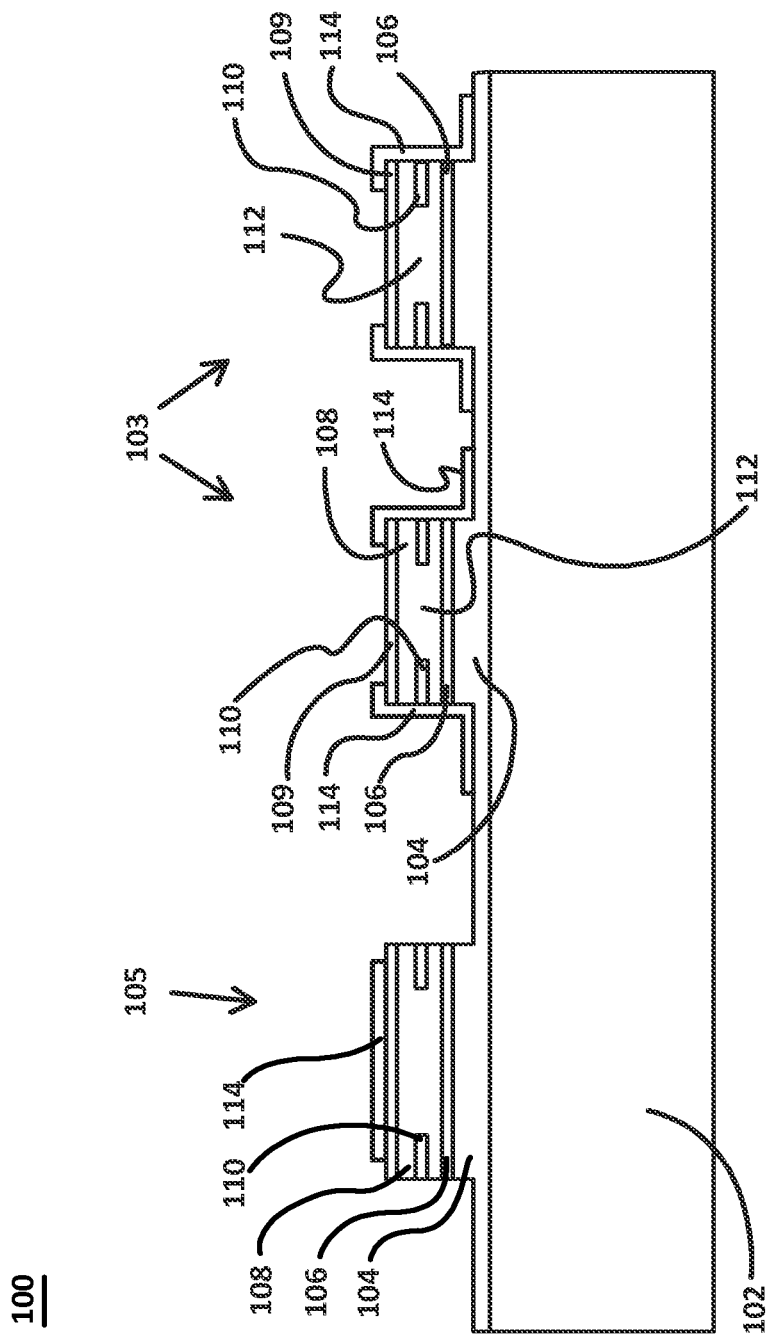
FIG. 1 is a simplified cross-sectional view illustrating the mesa structures of both the VCSEL devices and the shorting mesa devices, including dielectric deposition, metal deposition, and oxidation structures, among others features in accordance with an embodiment.

VCSEL array devices, such as those described in U.S. Pat. No. 5,812,571, are flip chip VCSEL array devices that employ a metal contact layer that is also used as a reflector for the top mirrors, and which is formed over each of the mesas. This single metal layer is customarily deposited with techniques such as electron beam (e-beam) evaporation or sputtering in order to create a highly uniform or reflective surface. Although these deposition techniques are normal for the stated application, they are not appropriate when seeking to achieve a thick metal layer encompassing the mesa, which is crucial for improved heat reduction in such devices. In order to use existing techniques to deposit a sufficiently thick layer, a large amount of metal must be used, such as Gold (Au), which significantly raises the cost of such devices. This type of design, and the design of other existing VCSEL array devices, also raises the overall impedance of the system and complicates heat management, thereby limiting the power and speed obtainable by such arrays.

In an embodiment described herein, the dissipation of heat, and the reduction of both parasitic capacitance and inductance (collectively referred to herein as a "reduction in parasitic impedance") from an optical semiconductor device array are achieved by reducing the common p contact area to a minimal size and increasing the distance between the common contact pad and the substrate ground, while surrounding the common contact pad with a ground plane at a distance derived from the properties of a coplanar waveguide, and forming a raised heat sink proximate to each active mesa element and grounding mesa in the array. The minimized common p contact area of the embodiment departs significantly from existing designs which require an extended common p contact area in order to make contact with wire bonds. The embodiment eliminates the need for wire bonds. The elimination of wire leads reduces inductance, while the raised height of the resulting mesas and heat sink structure increases the distance between the negative and positive potentials under electrical bias from the substrate ground to the contact pad on the heat sink substrate, thereby reducing the overall parasitic capacitance of the system. This is achieved through the use of a seed layer for formation of a thick plated metal heat sink that allows for much greater heat reduction through the edge of each VCSEL, as well as improving frequency response.

Additionally, the ground (or negative) electrical connection is contacted through shorted mesa devices bringing the current flow through a coplanar lead and to the heat spreader, or heat reducing substrate, without the use of wire bonds. Wire bonds are used in existing designs to connect the top of the substrate to the ground of the package and are undesirable because they introduce parasitic inductance, which has negative effects on the frequency response of VCSEL array devices. Furthermore, the numerous wire bonds required by existing designs introduce significant manufacturing complexity, greater potential for defects, and increased costs.

FIG. 1 shows a simplified schematic cross-section of VCSEL array device 100 in accordance with an embodiment. It will be understood that the illustration of the VCSEL array device in the embodiment shows a semiconductor device array and a method of fabricating and bonding the semiconductor device array. It will be understood, however, that the method disclosed therein can be used to fabricate arrays of other semiconductor devices, such as light emitting diodes, photodetectors, edge-emitting lasers, modulators, high electron mobility transistors, resonant tunneling diodes, heterojunction bipolar transistors, quantum dot lasers and the like. Further, it will be understood that the illustration of VCSEL array device 100 in the embodiment is for illustrative purposes only and is in no way meant to limit the scope of the invention.

In the embodiment, VCSEL array device 100 includes a substrate 102 which includes Gallium Arsenide (GaAs), although other materials such as Indium Phosphide (InP), Indium Arsenide (InAs), Silicon (Si), an epitaxially grown material, and the like, could be used to form the substrate 102. It will also be understood that substrate 102 typically includes a lattice constant chosen to minimize defects in a material layer subsequently grown thereon. It will also be understood that the choice of at least one of the compositions and the thicknesses of the subsequently grown material layers will provide a desired wavelength of operation. Subsequent layers are deposited on the substrate 102 via epitaxial growth using Molecular Beam Epitaxy (MBE), Metal-Organo-Chemical Vapor Deposition (MOCVD), and the like.

In the embodiment, a lattice-matched lower Distributed Bragg Reflector (DBR) 104 is epitaxily deposited on substrate 102 to form the first of the raised layers of the VCSEL mesas 103 and the short-circuiting/shorting/grounding mesa 105. The lower DBR 104 is formed from multiple layers of alternating materials with varying (a high and a low) indexes of refraction, or by periodic variation of some characteristic, such as height, of a dielectric waveguide, resulting in periodic variation in the effective refractive index in the guide. Each layer boundary causes a partial reflection of an optical wave, with the resulting combination of layers acting as a high-quality reflector at a desired wavelength of operation. Thus, while the lower DBR 104 (and upper DBR 108, as further described below) includes more than one material layer, it is illustrated in FIG. 1 as being comprised of a single layer for simplicity and ease of discussion herein. A portion of lower DBR 104 can also be made conductive to allow an electrical contact (not shown) to be made to the VCSEL array device.

In the embodiment, an active region 106 is epitaxily deposited on lower DBR 104. Although shown as a single layer (again for simplicity and ease of discussion), active region 106 comprises cladding (and/or waveguiding) layers, barrier layers, and an active material capable of emitting a substantial amount of light at a desired wavelength of operation. In the embodiment, the wavelength of operation is a wavelength within a range approximately given from about 620 nm to about 1600 nm (for a GaAs substrate). However, it will be understood that other wavelength ranges may be desired and will depend on the application.

As is understood by those skilled in the art, the wavelength of emission is substantially determined according to the choice of materials used to create lower DBR 104 and upper DBR 108, as well as the composition of the active region 106. Further, it will be understood that active region 106 can include various light emitting structures, such as quantum dots, quantum wells, or the like.

In the embodiment, upper DBR 108 is positioned on active region 106, and like lower DBR 104, is electrically conductive to allow ohmic electrical connections to be formed (not shown). In some embodiments, lower DBR 104 is n-doped and upper DBR 108 is p-doped, but this can be reversed, where lower DBR 104 is p-doped and upper DBR 108 is n-doped. In other embodiments, electrically insulating DBRs can be employed (not shown), which utilize intra-cavity contacts and layers closer to the active region.

In some embodiments, an upper mirror contacting layer 109 is positioned on upper DBR 108. Contacting layer 109 is typically heavily doped so as to facilitate ohmic electrical connection to a metal deposited on contacting layer 109, and hence to an electrical circuit (not shown). In some embodiments, contacting layer 109 can be formed as part of upper DBR 108.

Lithography and etching can be used to define each of the mesas 103 and 105 and their structures stated above. This can be achieved by patterning the epitaxially-grown layers through a common photolithography step, such as coating, exposing, and developing a positive thick resist. The thickness of the resist can be varied as is known in the art, depending on etch-selectivity between the resist and the epitaxial layers, and the desired mesa geometry.

For GaAs-based materials, etching is usually accomplished using a Chlorine (Cl) based dry etch plasma, such as Cl2:BCl3, but any number of gases or mixtures thereof could be used. Etching can also be accomplished by many wet etchants. Other forms of etching, such as ion milling or reactive ion beam etching and the like, can also be used. The depth of the etch is chosen to be deep enough to isolate the active regions of mesas in the array. The etch stops either on the N mirror (lower DBR 104), an etch stop/contact layer formed in the N mirror (lower DBR 104), or through the N mirror (lower DBR 104) into the substrate 102. After etching to form the mesas, the remaining photoresist is removed. This can be achieved using a wet solvent clean or dry Oxygen (O2) etching or a combination of both.

A confinement region 110 can also be formed within each of the mesas. Within the VCSEL mesas 103, the confinement region 110 defines an aperture 112 for the device. The confinement region 110 can be formed as an index guide region, a current guide region, and the like, and provides optical and/or carrier confinement to aperture 112. Confinement regions 110 can be formed by oxidation, ion implantation and etching. For example, an oxidation of a high Aluminum (Al) content layer (or layers) can be achieved by timing the placement of the wafer or sample in an environment of heated Nitrogen (N2) bubbled through Water (H2O) and injected into a furnace generally over 400° C. A photolithographic step to define an ion implant area for current confinement, and combinations of these techniques and others known in the art, can also be used.

It will be understood that confinement region 110, defining aperture 112, can include more than one material layer, but is illustrated in the embodiment as including one layer for simplicity and ease of discussion. It will also be understood that more than one confinement region can be used.

In the embodiments shown in the Figures, the mesa size, and apertures of the light producing VCSELs are the same and have uniform spacing. However, in some embodiments, the individual VCSEL mesa size for the devices in an array can differ. Furthermore, the VCSEL mesa spacing in the array can differ. In some embodiments, the separation of the light producing VCSELs mesas in an array 100 is between approximately 20 μm and 200 μm. However, larger and smaller separations are also possible.

Dielectric deposition can be used and processed to define an opening for a contact surface. First, the deposition of a dielectric material 114 over the entire surface of the device 100 is usually accomplished by Plasma Enhanced Chemical Vapor Deposition (PECVD), but other techniques, such as Atomic Layer Deposition (ALD), can be used. In the embodiment, the dielectric coating 114 is a conformal coating over the upper surface (including the mesa sidewalls) and is sufficiently thick so as to prevent current leakage through pinholes from subsequent metal layers.

Other properties to consider while choosing the thickness of this film is the capacitance created between the plated metal heat sink 124 (further described below with reference to FIG. 2) and the substrate 102 ground, where the dielectric layer 114 would be more beneficial to be thicker, and the need for the dielectric layer 114 on the sidewalls of the VCSEL 103 to transfer heat from the active region to the heat sink 124, where a thinner layer would be beneficial. In some embodiments, multiple depositions using different deposition techniques can be used to accomplish a layer with both of these properties. An example of this technique is to follow a deposition of PECVD Silicon Nitride (Si3N4) with an E-beam deposition of Si3N4, or another dielectric could be deposited that has a more directional deposition rate, thereby putting thicker dielectric material on the incident surfaces. Once the dielectric layer 114 has been formed, a photolithographic process is then used to define openings in the dielectric over each of the VCSELs mesas where contact is to be made to the top mirror contact layer 109. The dielectric layer 114 is also removed over the substrate 102 between each of the VCSEL mesas 103, over the substrate 102 surrounding the ground mesa 105, and over the top and side of each ground mesa 105.

Figure 2:
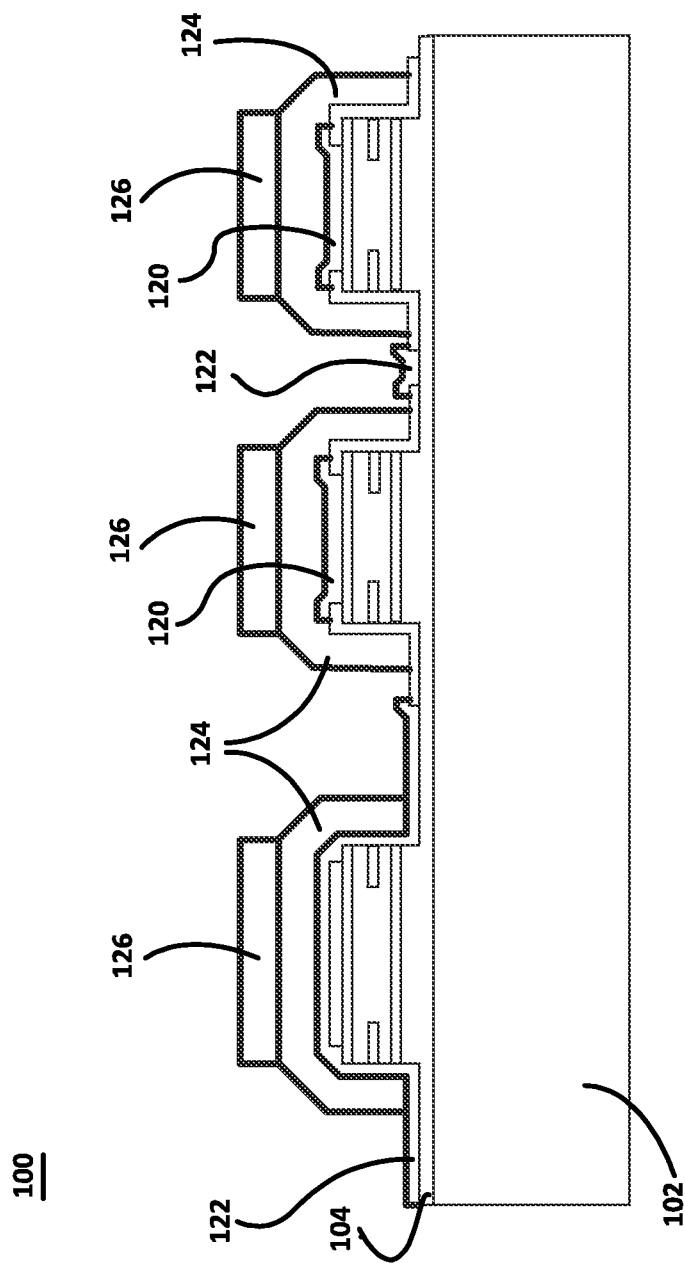
FIG. 2 is another simplified cross-sectional view of the VCSEL devices and the shorting mesa devices, further illustrating heat sinks, bonding layers, and other features in accordance with an embodiment.

Turning now to FIG. 2, the next processing step is a photolithographic process that is used to define the contacts over the top mirrors 108, where the dielectric was opened in the above step, so that a P-metal layer can be formed therein in a subsequent step. In the embodiment, the opened area in the photoresist is slightly larger than the opening in the dielectric, typically of the order of a few μm wider. In other embodiments, its diameter can be smaller than the diameter of the dielectric opening, or as large as the diameter of the heat sink material over the shorted mesas, which is plated at a later step. This opening could not be any larger than the mesa diameter in an active light producing mesa or the subsequent metals would short out the P and N potentials, unless the dielectric coating is conformal and covering the N mirror portion at the mesa base.

Once the opened areas in the photoresist are defined, metalization can be performed, typically with a P-type metal, over the opened areas. The P-metal contact layer 120 is usually a multilayer deposition that is deposited by E-beam, resistive evaporation, sputter, or any other metal deposition techniques. A thin Titanium (Ti) layer is first deposited for adhesion of the next layer. The thickness of this adhesion layer can vary greatly, but is generally chosen to be between about 50 Å and about 400 Å as the Ti films are stressful and more resistive than the subsequent layers. In an embodiment, the adhesion layer is approximately 200 Å thick. Other adhesive metal layers can be substituted for this layer such as Chromium (Cr), Palladium (Pd), Nickel (Ni), and the like. Also this layer can serve as a reflector layer to increase reflectance of the contacting mirror.

The next layer is deposited directly on top of the adhesion layer without breaking vacuum during the deposition. In many cases this layer acts as a guard against the Gold (Au) or other top metals from diffusing too far into the contact (a diffusion barrier) because of excessive heating at the bonding stage. Metals chosen are generally Pd, Platinum (Pt), Ni, Tungsten (W), or other metals or combinations of these metals chosen for this purpose. The thickness chosen should depend upon specific bonding temperatures needed in the flip chip process. The thickness of this layer is typically between about 1,000 Å and about 10,000 Å. In embodiments where a low temperature bonding process is used, for example an Indium bonding process, a diffusion barrier layer can be optional, and not deposited as part of the metal contact stack.

The next layer is generally Au but can be Pd or Pt or mixtures such as Gold Beryllium (AuBe) or Gold Zinc (AuZn). In the embodiment described below, the thickness of this layer is approximately 2,000 Å. However, it can generally have a wide range of thicknesses depending on the photo resist properties and heating characteristics of the deposition. In some embodiments, another metal can also be deposited at this time to increase metal thickness and to form the metal heat sink at this stage, thereby reducing the number of processing steps, but this technique is not necessary and was not utilized in the demonstration devices described below.

Generally a common liftoff technique is chosen for this photolithographic process so that the metal deposited on the surface can easily be separated from the areas of the surface covered with photoresist, such that any metal on the photoresist is removed without sticking to or affecting the adhesion of the metal to the semiconductor.

As noted above, a photolithographic process is then used to define the openings over various portions of the substrate 102 and the shorted N contact mesas 105, where the dielectric was opened in a previous step. In an embodiment, the opened area in the photoresist corresponding to the N-metal deposition should be slightly larger than the opening in the dielectric openings for the N-metal. N-metal layer 122 is then deposited and can form an electrical circuit with the substrate 102 either through the lower DBR 104 (if an N-mirror), an etch stop and contact layer which is generally heavily doped within lower DBR 104, or to substrate 102 itself. The process to form the N-metal layer 122 is similar to that for the P-metal layer 120. The metal layers can be chosen to include the combinations of Ni/Ge/Au, Ge/Au/Ni/Au, or many such combinations. In some embodiments, the first layer or layers are chosen to reduce contact resistance by diffusion into the N-doped epitaxial material of the substrate 102. In other embodiments, the first layer of the multi layer metal stack can also be chosen as a diffusion-limiting layer such as Ni so that in the annealing process the metals do not "clump" and separate due to the various diffusion properties of the materials. Evenly distributing diffusion of these metals is desired and can be used to lower the contact resistance which also reduces heating. The thickness of this multi-layer metal stack can vary greatly. In the embodiment to be described, a Ni/Ge/Au metal stack with thicknesses of 400 Å/280 Å/2,000 Å, respectively, was used.

A Rapid Thermal Anneal (RTA) step is then performed on the wafer in order to lower contact resistance. For the embodiment described, the process temperature is rapidly ramped up to ~400° C., held for about 30 seconds and ramped down to room temperature. The temperature and time conditions for the RTA step depend on the metalization, and can be determined using a Design Of Experiment (DOE), as known to those of ordinary skill in the art.

In other embodiments, this step can be performed at an earlier or later stage of the process flow, but is generally done before solder is deposited so as to reduce oxidation of the solder or adhesive metal.

A photolithographic process (using a thin layer of photoresist, typically around 1 um to 3 um, is used and developed to define the contact openings over the substrate 102 and shorted N contact mesas 105, and active mesas 103 where the heat sink structures will be plated or built up. The next step is deposition of the metal seed layer and is usually a multilayer deposition and deposited by E-beam, resistive evaporation, sputter or any other metal deposition techniques. The metal layers can be chosen such as Ti/Au, 20 Å/600 Å, or many such combinations where the first layer or layers is deposited for adhesion and ease to etch off, and the second layer for conductivity and ease to etch off. The seed layer is continuous over the surface allowing electrical connections for plating, if this technique is used for building up the heat sinks.

In an embodiment, a thick metal is then deposited by plating, to form heat sink 124. However, other methods of deposition can also be used, in which case the metal seed layer is not required. For plating, a photolithographic process is used to define the openings over the openings defined with the previous seed layer resist. The photoresist is removed in the areas where the deposition will occur. The thickness of the photoresist must be chosen so that it will lift off easily after the thick metal is defined and typically ranges in thickness from about 4 um to about 12 um. A plasma clean using O2, or water in combination with Ammonium Hydroxide, (NH4OH), is performed to clear any of the resist left on the gold seed layer. The heat sink 124 metal is plated next by means of a standard plating procedure. In the embodiment described, Copper (Cu) was chosen as the metal for plating due to its thermal conductance properties, but non-oxidizing metals, such as Au, Pd, Pt, or the like, that provide good thermal conductance and provide an interface that does not degrade device reliability, could be more appropriate. Plating thicknesses can vary. In the embodiment described, an approximately 3 µm thickness was used.

Next the wafer or sample is placed in a solder plating solution such as Indium (In) plating to form a bonding layer 126. Other metals can be chosen at this step for their bonding characteristics. The thickness can vary greatly. In the embodiment described, approximately 2 µm of plated In was deposited on the heat sinks. However, other solders such as Gold Tin (AuSn) alloys can also be used, and alternative deposition techniques such as sputtering can also be used. After metal deposition is complete, the photoresist is then removed using solvents, plasma cleaned, or a combination of both, as previously described, and the seed layer is etched with a dry or wet etch that etches Au, then etched in a dry or wet etch that etches Ti and/or removes TiO2. The seed layer photoresist is then cleaned off with standard resist cleaning methods. At this point, the VCSEL array substrate is complete and ready for bonding.

The full encasement of the mesas with a thick heat sink material is an important aspect of the embodiment. Since the active regions of the mesas are closest to the edge where the thick heat sink material is formed, there is good thermal conductance, thereby enabling the design of the embodiment to efficiently and effectively remove heat generated by those active regions. As previously noted, this is a significant departure from existing VCSEL array device heat reduction techniques, which place the heat sink material on top of the mesa. These existing or prior designs require heat to move through a series of higher thermally conductive materials (mirrors) or dielectrics, thereby resulting in less efficient and effective heat reduction.

Although some existing designs encompass the mesa with a thin layer of heat sink material, for the purpose of reducing heat, these designs do not take into the consideration the height of the resulting heat sink. By using a thick heat sink layer and adding to the distance between the N substrate ground potential and the P contact plane on the heat sink substrate, present embodiments decrease parasitic capacitance of the system as the height of the heat sink layer is increased. Further, in addition to reducing heat, the build-up of additional material increases frequency response. In another embodiment, the dielectric layer 114 covers the entire N mirror or substrate around the mesas and is not opened so that the heat sink material can completely encompass all mesas and form one large heat sink structure, instead of individual mesas of heat sinks. In this case, the N contacts would only be needed to extend from the short circuited mesas to the substrate. The heat sinks of the embodiment also improve the operation of the VCSEL array by reducing the amount of heat generated by neighboring mesas. A reduction in thermal resistance within most electrical devices will increase the frequency response of each device. By improving the thermal performance of the VCSEL array device of the present device, a significant increase in the high speed performance of the VCSEL array device is made possible. Furthermore, in this embodiment it is also evident that the extra height given the mesas, because of the thickened heat sinking build up compared to the existing array circuits, reduces capacitance by increasing the distance between the substrate ground plane and the positive contact plate connecting all active mesas in parallel. The resultant effect is a reduction in parasitic impedance of the circuit which also increases the frequency response of the entire array.

Also, the short circuited mesa design, which forms a subarray surrounding the active regions, allows current flow directly from the fabricated VCSEL substrate to the ground plane on the heat spreader without the use of forming multiple wire bonds. This aspect of the embodiment reduces the complexity of fabrication, and also reduces parasitic inductance from the multiple wire bonds exhibited in the existing arrays. The short circuited mesa design, when flipped chipped to the heat spreader substrate, forms a coplanar waveguide which is beneficial to the frequency response of the array. This design feature also enables simpler packaging designs that do not require raised wire bonds, which also impact reliability and positioning.

Figure 3:
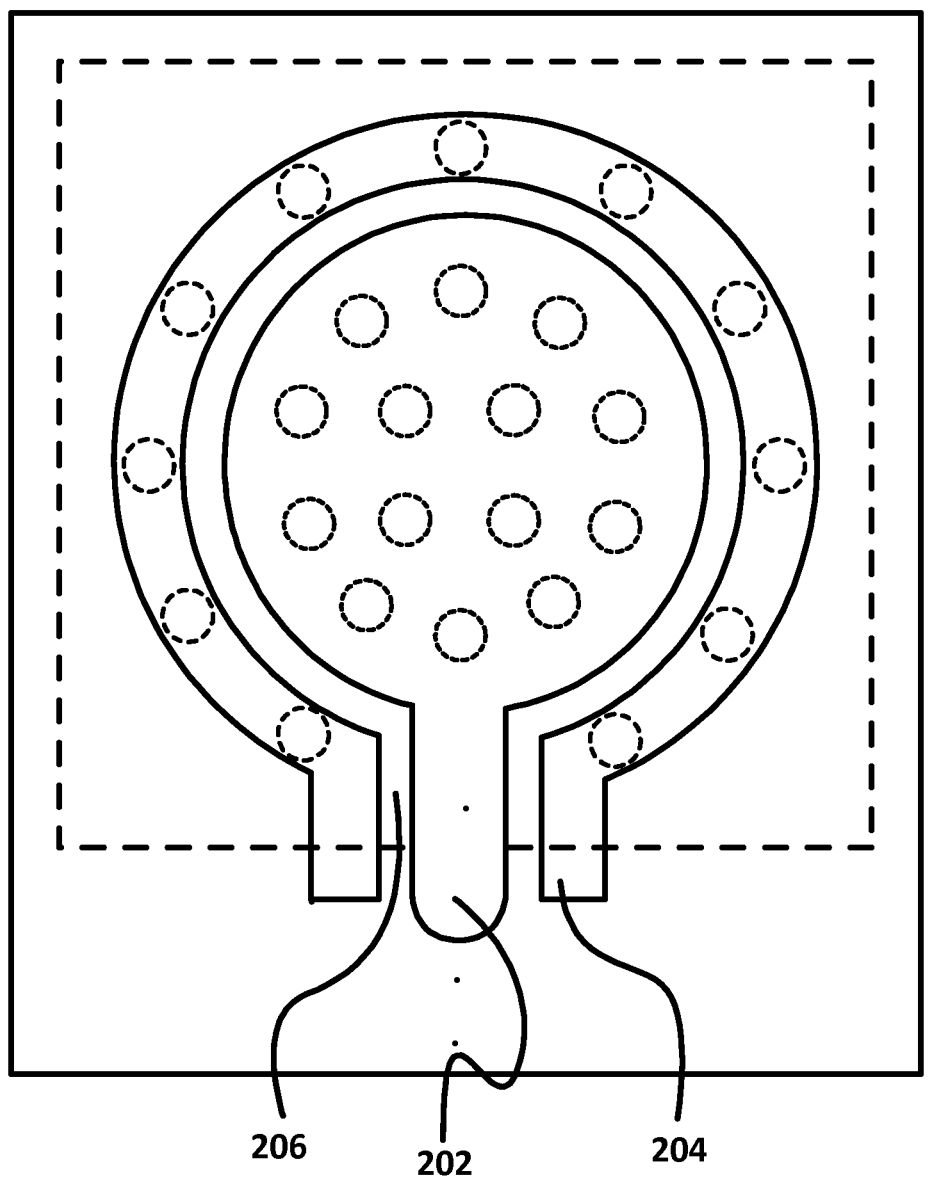
FIG. 3A is a top plan view of a patterned heat spreading substrate illustrating the coplanar waveguide formed from the encircling grounding plane, the signal lead to ground plane gap separation, and the signal lead in accordance with an embodiment.
FIG. 3B is an embodiment of the coplanar waveguide for FIG. 3A with the grounding plane extending to the edges of the heat sink and forming a loop around the contact pad of VCSEL devices.
Figure 3:
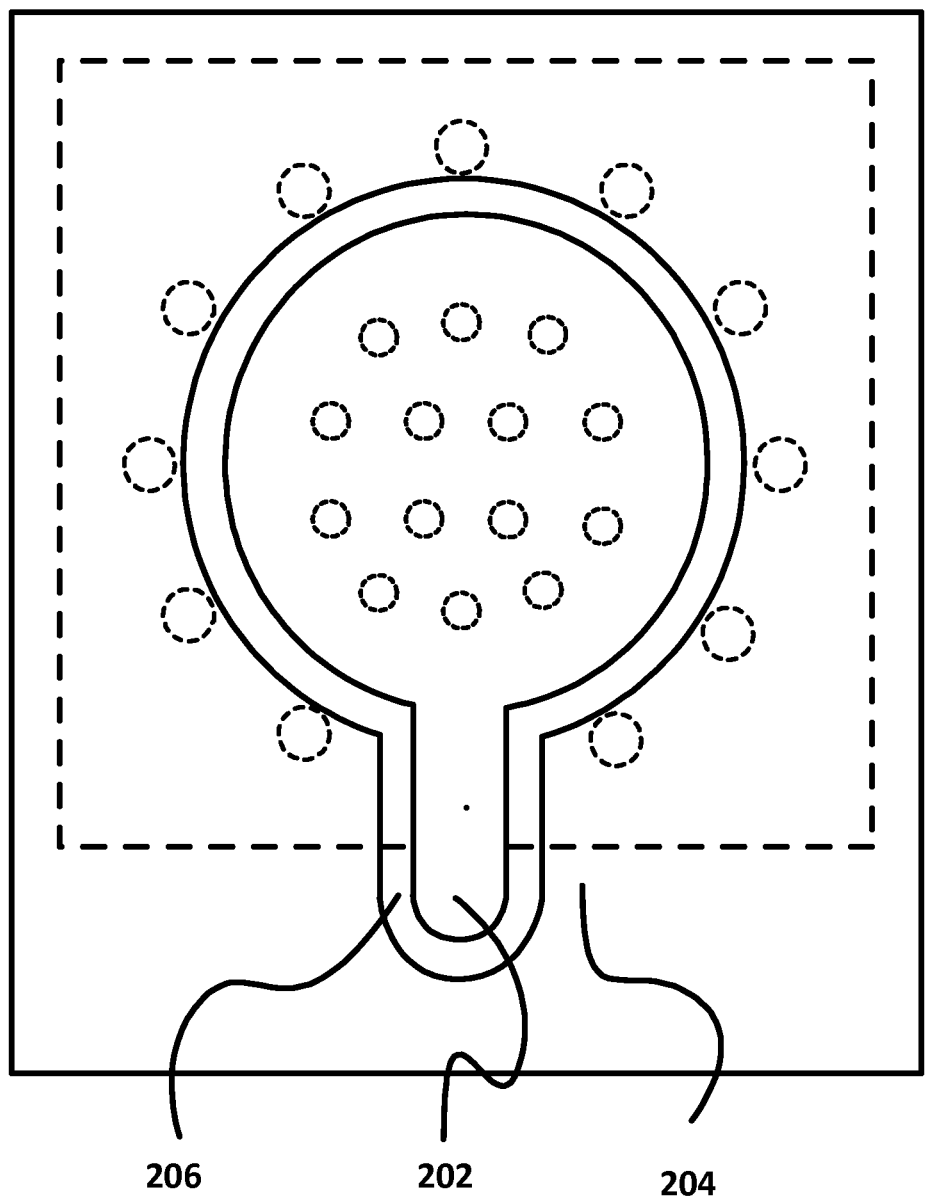

Referring now to FIG. 3A, the process for preparing the heat spreading or heat-reducing substrate 200 which is electrically non conductive, to be attached to the array 100 is described. First, a photoresist is deposited and defined over the surface of a substrate. Generally a common liftoff technique is then chosen for the next photolithographic process so that a metal is deposited on the surface and can easily be removed from the areas of the surface covered with photoresist. The metal layer is then deposited with any method. The photoresist is cleaned off by any standard resist cleaning technique. Once this has been accomplished, the heat spreader or heat reducing substrate is ready for flip chip bonding.

Two contact pads are then created—a first contact pad 202 for connection to the VCSEL devices 103, and a second contact pad 204 for connection to the short circuited mesa devices 105.

In another embodiment the metal can be deposited upon the entire surface of the dielectric material and then defined with a photolithographic process while exposed areas are etched away leaving two non-connected metal pads 202 and 204. In the embodiment, first contact pad (or signal pad) 202 is approximately circular and second contact pad (or grounding pad) 204 forms a loop around first contact pad 202, so as to form a coplanar waveguide lead in a ground-signal-ground configuration. This configuration is well known for superior signal characteristics and allows flexible device testing and packaging. In other embodiments the contact pad 202 can be square or another shape with the grounding pad 204 forming a loop around it, such as is shown in FIG. 3B. The grounding plane or loop must have a consistent gap 206 width from the contact pad 202 to maintain the best operating characteristics, however, the rest of the ground metal can extend beyond the ring shown in FIG. 3A, and even to the edges of the substrate, as shown in FIG. 3B, for ease of grounding connections.

The coplanar waveguide can be designed to match impedances of the driver circuit by simply adjusting the gap width 206 and/or the signal lead width based on given metal and non-conducting substrate thicknesses and material characteristics. The formulas for calculating the impedance of coplanar waveguides having a dielectric substrate of finite thickness are well known, but lengthy and are not repeated here. By example, however, for a substrate of diamond with a 5.5 dielectric constant, a thickness of the metal layer of 20 μm, a width of the signal lead of 1 mm, and desired impedance of the driver of 50 ohms, the calculated width of the gap (between the signal pad and the ground) should be 200 μm, or 0.2 mm. More accurate calculations requiring many higher order considerations, such as current limits, hysteresis, temperature, surface characteristics and background considerations, could also be performed.

As illustrated in FIGS. 3A and 3B, the VCSEL array and short circuited mesa array are shown as dotted lines to represent where the VCSEL array and the short circuit mesa array will be bonded to the heat spreader substrate, and hence the location of both arrays after bonding. Optionally, In plating or the like for the bonding deposition can also be formed on the heat spreader substrate 200 at these locations. The laser emission is then directed through the mirror 104 and on through the substrate 102 forming a multibeam array. In an embodiment the substrate thickness is reduced to reduce optical power losses resulting from substrate transmission characteristics.

Figure 10:
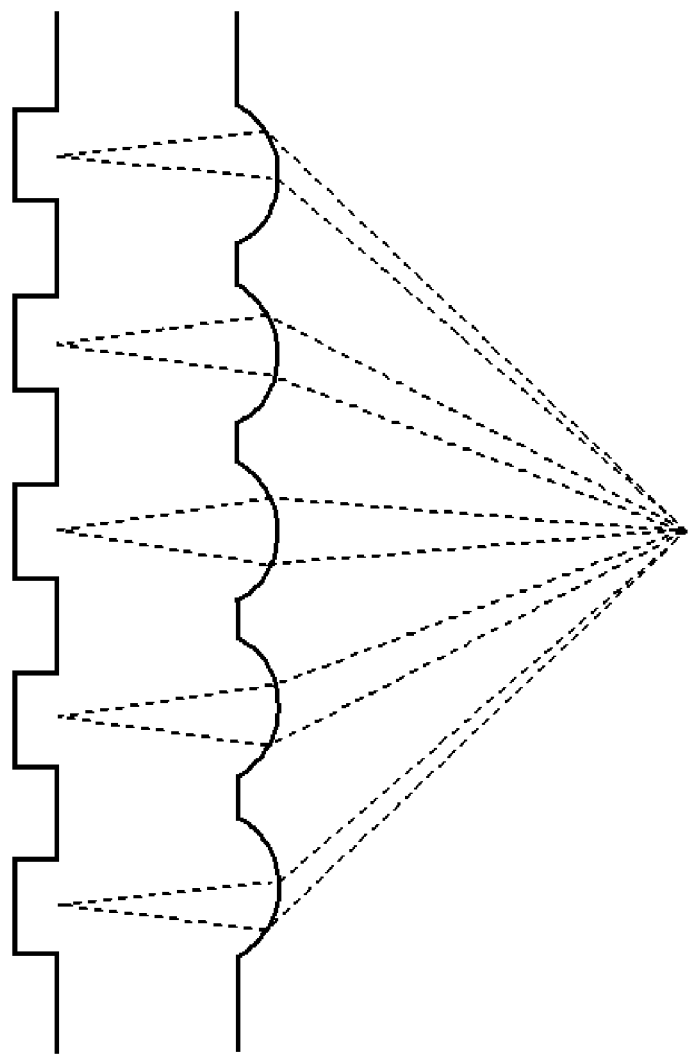
FIG. 10 is a partially-broken, cross-section view of a plurality of lenses positioned on top of a VCSEL devices in accordance with an embodiment.
Figure 11:
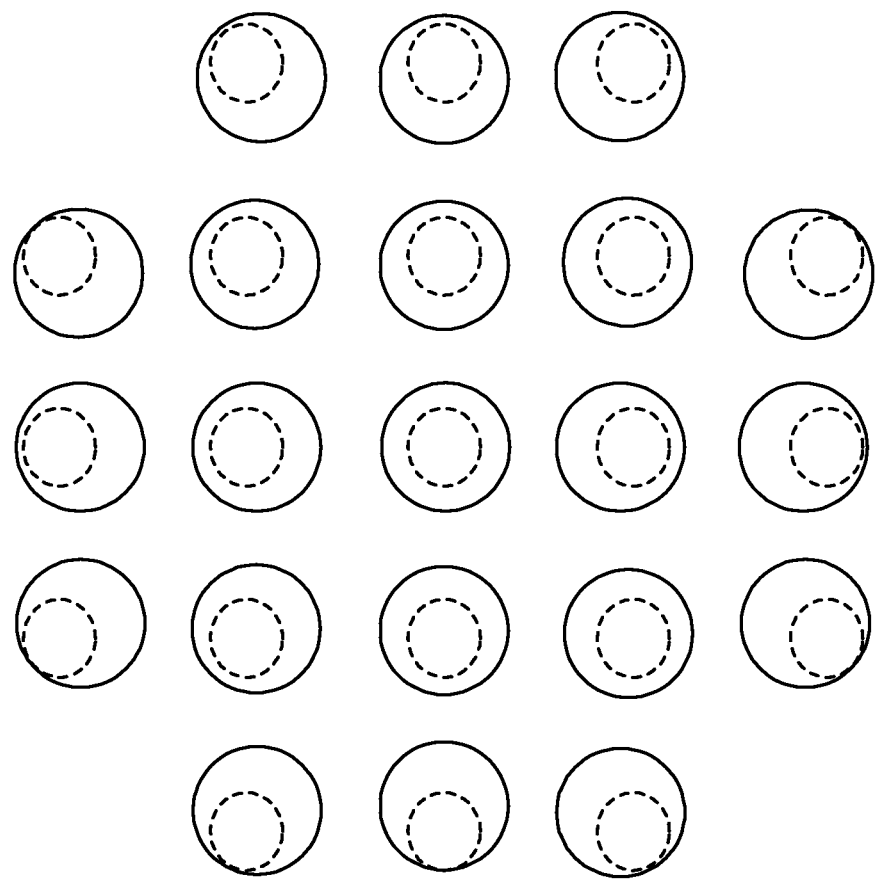
FIG. 11 is an illustration of the manner in which each lens of the plurality of lenses is placed in an offset position over each VCSEL device of the VCSEL array device.

As further illustrated in FIGS. 10 and 11, lenses for collimating or focusing light emitted by the VCSEL arrays can be easily fabricated on the backside of the surface of substrate 102 by using a photolithography process to define the lens with photoresist, flowing the photoresist with heat and then transferring those lenses to the substrate through an etch, which is generally a Chlorine (Cl) based dry etch adjusted for or approaching an even etch selectivity between the substrate material and the photoresist, so as to etch both materials at close to or the same rate.

As illustrated in FIG. 10, which for ease of demonstration is not drawn to scale, the aperture (the diameter) and curvature of each resulting lens will focus the light emitted by each VCSEL device in a desired manner. In order to focus the light from each VCSEL device in a VCSEL array, each lens can be offset by a desired amount to cause what would otherwise be a spread of parallel beams of light emitted by the VCSEL array to be focused into a selected pattern, such as on a tightly focused spot (as previously noted, the distance from the lenses to the beam convergence point of FIG. 10 is not drawn to scale). FIGS. 10 and 11 further illustrate how the lens for the centered VCSEL device is centered over the VCSEL device, but the lenses for the other VCSEL devices outside of the centered VCSEL device are positioned at a specified offset distance from the centered VCSEL device so that light passing through those lenses is directed to a central point. The manner in which a group of lenses (represented by solid circles) might be offset positioned over an array of VCSEL devices (represented by dashed circles) is illustrated in FIG. 11.

The photolithographic step used to create the lenses is accomplished using a backside wafer alignment system common in the industry. This step would be fabricated either at the end of fabrication of the VCSEL wafer or earlier, but generally before the flip chip process.

Figure 4:
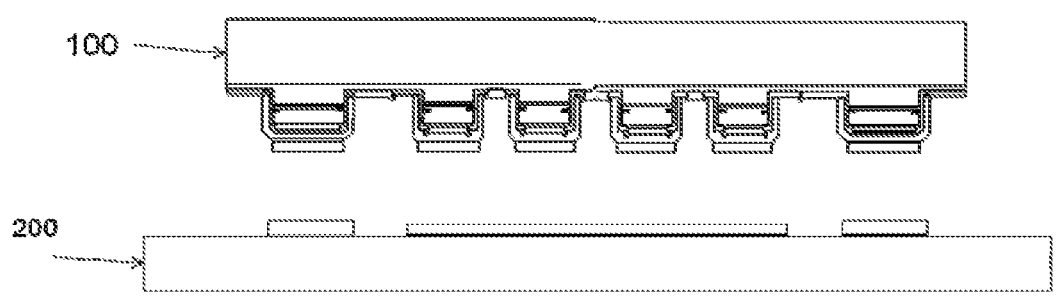
FIG. 4 is a cross-section view of the VCSEL array device of FIG. 2 and the heat spreading substrate of FIG. 3A prior to bonding.

A flip chip bonding is performed on the two substrates with the heat spreader substrate on the bottom. FIG. 4 shows an alignment of VCSEL array 100 with substrate 200, prior to bonding. The bonding process is accomplished by a machine that aligns the two substrates together, then places them in contact with each other and heats one or both substrates either before or after contacting said substrates. In the embodiment described, the bottom substrate was heated to about 285° C. and held at that temperature for about 10 min. A 20 gram weight was used on the downward substrate position. The bonded wafers were allowed to cool to room temperature, finishing their processing.

In another embodiment after flip chip bonding, the substrate 102 can be removed from the mirrors 104 by adding a selectively etched layer such as a layer of Aluminum Gallium Arsenide (AlGaAs) (~98%, Al), with a high Aluminum (Al) content or the like, or a layer composed of Indium Gallium Phosphide (InGaP), or other such selective materials that will etch at greatly different rates than the Galium Arsenide (GaAs) substrate. This layer is grown in the epi growth between substrate 102 and the first epi deposition of mirror 104. Before the etch is added, an under fill of material, such as resist or epoxy, is used to protect the device fabrication features.

An etch consisting of mostly Hydrogen Peroxide (H2O2) with a small amount of Ammonium Hydroxide (NH4OH) can be used to quickly etch off the substrate leaving the etch selective layer, as the etch will not attack it or the etch rate slows down drastically. After removal of the substrate material the etch layer can be selectively removed without damaging the surface of the material under it by etching the layer in a Hydrochloric acid (Hcl) solution. If substrate removal is done, generally a low resistive contact layer is also grown as a first layer for formation of an N contact layer as part of mirror 104. After the substrate and selective etch layers have been removed, contacts can be formed on the surface of 104 and circuits can also be formed with common photolithography steps described above.

If the mesas are etched to the substrate, this process could separate each of the VCSEL elements and short circuited mesas from each other, which would benefit the VCSEL array by removing the Coefficient of Thermal Expansion (CTE) associated with the substrate. The CTE is a physical property of materials expressed as the amount of expansion of the material per degrees Celsius. Many times, when multiple materials are used to build devices and the CTEs of those materials do not closely match, stresses can be produced within the device with any temperature changes. With the mesa devices etched to the substrate, the devices will expand at the same rate as the heat sink substrate, except over the much smaller area of where the contacts to the heat sink substrate are formed. In another embodiment the etch process used to remove the substrate could use plasma based chemistry instead of the chemical wet etch technique described above.

The above described process flow is given by way of example only. It will be understood that switching the order of some of the steps described is possible, for example the order of the metal depositions, or depositing one or both of the N metal or P metal before the oxidation step. Also, it is possible to replace the top mirror structure 108 with a dielectric DBR stack, or replace the mirror stacks either entirely or partially by etching gratings on the top surfaces of the mesas. The gratings are usually defined by e-beam lithography instead of photolithography and then dry etched to a specific depth. This reflects the light back with a higher efficiency and is possibly less costly than the epitaxially grown mirror or portion of mirror it replaces.

Figure 5:
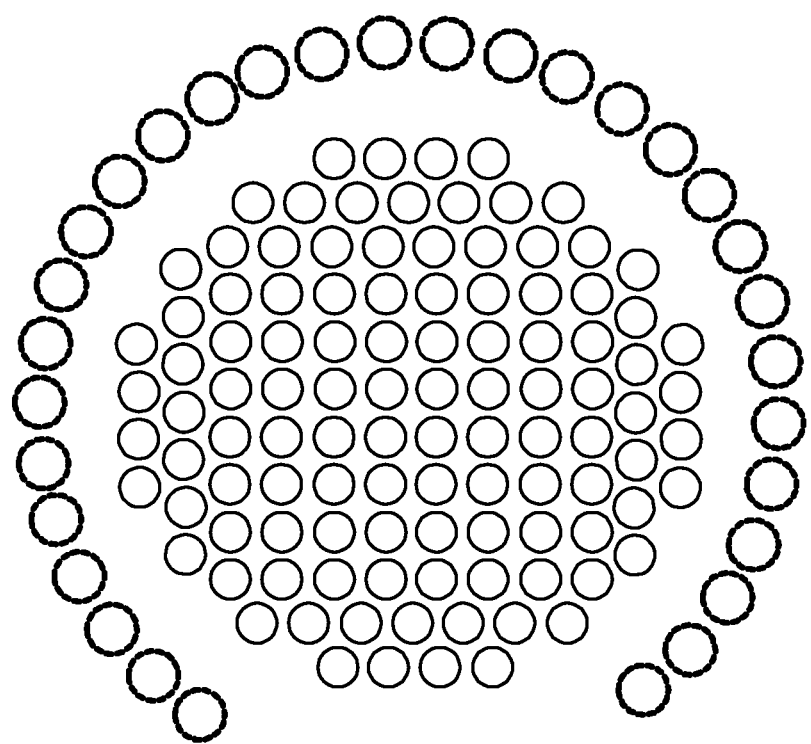
FIG. 5 is an illustration of an embodiment of a VCSEL array device after plating.

The arrays described above have been fabricated and tested. Arrays of high-speed, 980 nm high-power bottom emitting VCSELs have been fabricated. Devices with an active region diameter of 18 μm, in a 24 μm diameter mesa, have been created to form a circularly shaped VCSEL array with 70 μm device pitch. An example of an array formed in a similar manner and shape is illustrated by FIG. 5. Each of the single VCSEL devices (represented by solid circles in FIG. 5) in the VCSEL array are electrically connected in parallel to form a single high-power, high-speed light source. The parallel configuration for both signal and ground paths reduces the series resistance and inductance of the flip-chipped array. In another array that was fabricated and tested, the array used 28 active light producing mesas, evenly spaced apart. They were formed in a circular pattern and the entire area of the active region (contact pad) was less than 0.2 mm2. There were 18 shorted mesas (which are similar to those represented by dashed circles in FIG. 5 of the larger array device) in the grounding ring that surrounds the circular pattern of VCSEL devices.

The lasers (and arrays) of the tested devices were fabricated from layers grown using Molecular Beam Epitaxy (MBE) deposited on an N-type GaAs substrate. The light producing portion of the active region 106 in the device of FIG. 1 contains three Indium Gallium Arsenide (In0.18Ga0.82As) quantum wells. This VCSEL design employs a gain mode offset, which occurs when the wavelength design of the active region is not the same as the wavelength design of the mirrors at room temperature. When the device heats up, the emission wavelength from the active area will shift a specific amount per degree Celsius. A gain mode offset takes this shift into account, so when the mirrors are designed they match the emission wavelength at an elevated temperature. A gain-mode offset design is well suited for high temperature operation of the array at high bias currents. However, smaller offsets would enhance the modulation response at low temperatures and a lower reflectivity bottom mirror 104 would increase output power. The fabrication of this device with the processes mentioned above reduced thermal resistance down to 425° C./W for a single mesa identical to those used as elements in this array.

Figure 6:
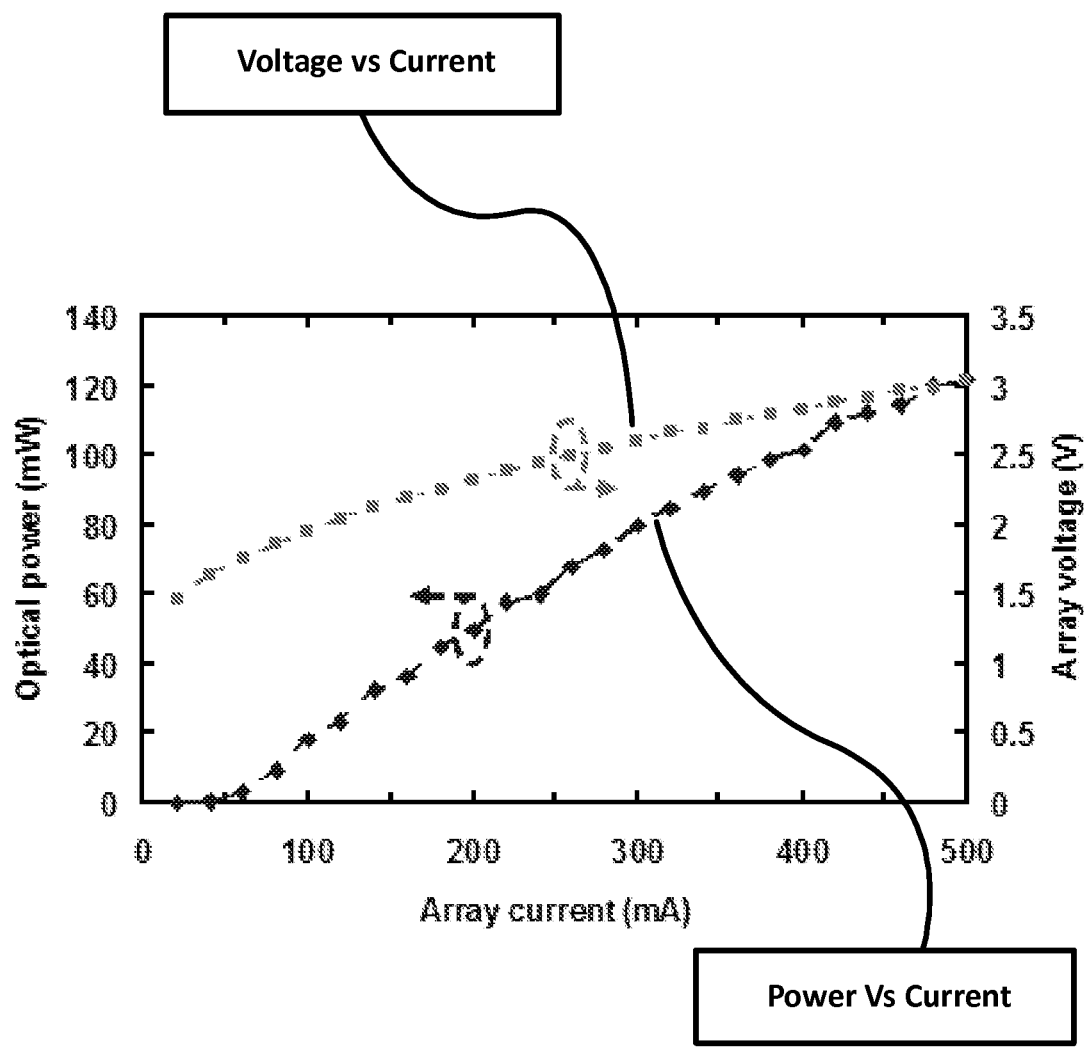
FIG. 6 is a graph showing L-I-V characteristics of an embodiment of a VCSEL array device.

The DC characteristics of the exemplary array were extracted using a Keithley 2400 source meter and a silicon photodiode along with an optical attenuator. FIG. 6 shows the Light-current (I)-Voltage (L-I-V) characteristics of an exemplary array. The threshold current and voltage are 40 mA and 1.7V respectively. The dashed circles over the two lines (representing voltage vs. current and power vs. current) indicate the sides of the chart each of the lines represent so the units can be read properly. The Continuous Wave (CW) output power of the array is above 120 mW at 500 mA bias current and room temperature.

Figure 7:
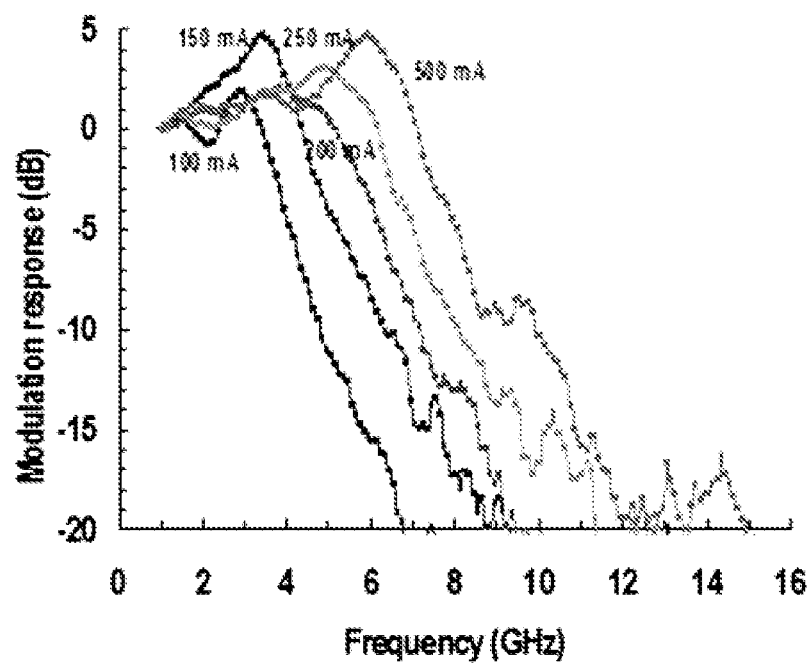
FIG. 7 is a graph showing modulation frequency for an embodiment of a VCSEL array device.

In order to measure the tested array's modulation response, it was biased at fixed currents up to the 500 mA maximum current rating of the Cascade Microtech high frequency probe used in the measurements. The output light was coupled into a multimode bare 62.5 µm core diameter fiber. The output signal of a Discovery Semiconductor DS30S p-i-n photodiode was then amplified by a Miteq radio-frequency low noise amplifier at different bias currents. FIG. 7 shows the modulation responses for selected bias currents at 20° C. The array exhibits a 3 dB frequency of 7.5 GHz at a 500 mA bias current. Cut off frequency of the high current Picosecond Pulse Labs bias tee employed here presents accurate measurements below 1 GHz. The bandwidth can be extended to higher frequencies by increasing the bias current. Frequency response measurements for a single 18 µm active diameter laser nominally identical to those constituting the test array show that a 3 dB modulation frequency of up to and above 10 GHz is achievable.

Figure 8:
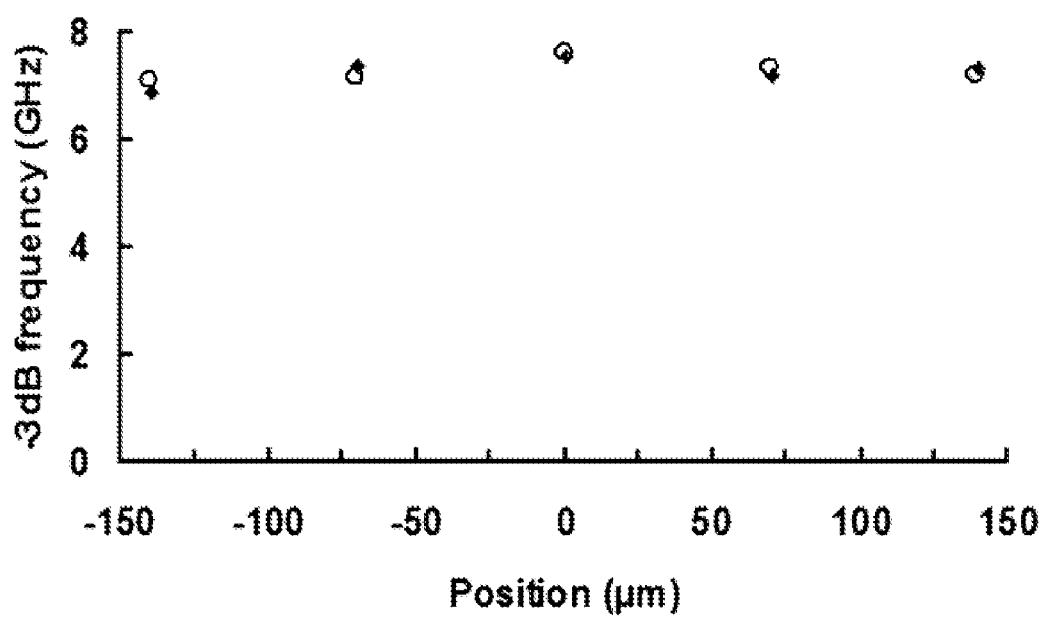
FIG. 8 is a graph showing laser modulation frequency for different array positions at 450 mA bias current for an embodiment of a VCSEL array device.

A bare multimode fiber was employed to scan the whole array area and measure the frequency response of array elements at different positions. FIG. 8 shows that the frequency response of elements of the array at different radii measured from the center of the array is nearly independent of position. Each point indicates the frequency response of an individual device in the array. This result indicates that both the individual laser performance and current distribution are relatively uniform over the entire array. Hence, VCSEL arrays in accordance with the embodiment can be scaled up to hundreds or thousands of elements to achieve watt level CW powers with modulation frequencies approaching 10 GHz. VCSEL arrays of this type are expected to be useful for moderate range, high resolution LIDAR and free-space communication, as well as numerous other applications.

Figure 9:
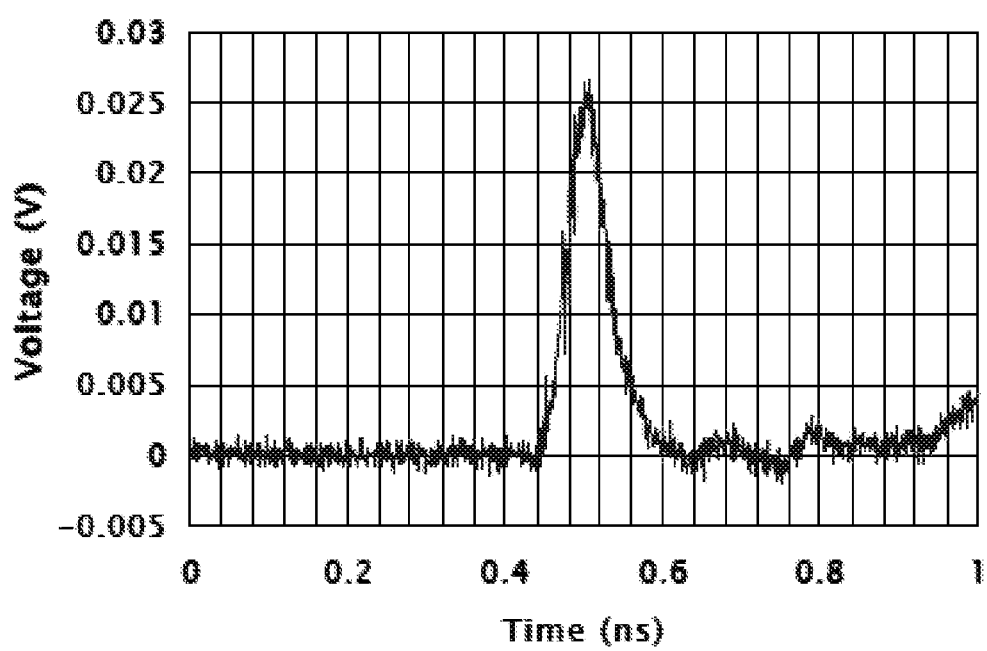
FIG. 9 is a graph showing pulse width from an embodiment of a VCSEL array device.

FIG. 9 shows a pulsed response of an exemplary array with a 50 ps pulse at FWHM (Full Width at Half Max), which indicates the width of the pulse at half of its maximum power. The lines of the chart represent 40 ps divisions.

Effective heat sinking of the device by metal plating and utilization of flip-chip bonding allows CW operation of the tested array at room temperature. As a result, a monolithic multibeam VCSEL array of the type manufactured and tested can have a superior frequency response over other multibeam semiconductor arrays, allowing the benefits of VCSEL beam quality, reliability, modulation flexibility, and cost efficiency to compete with edge emitting semiconductor laser arrays for applications requiring high power.

While the present invention has been illustrated and described herein in terms of several alternatives, it is to be understood that the techniques described herein can have a multitude of additional uses and applications. Accordingly, the invention should not be limited to just the particular description, embodiments and various drawing figures contained in this specification that merely illustrate a preferred embodiment, alternatives and application of the principles of the invention.

What is claimed is:

1. A high frequency VCSEL array device, comprising: two or more VCSEL devices sharing a common electrical contact and connected in parallel, each VCSEL device among the two or more VCSEL devices forming a first mesa on the common electrical contact, each first mesa including a dielectric layer positioned on a sidewall of each first mesa and in contact with the common electrical contact, a first mirror, a first metal contact, and an active region positioned between the first metal contact and the first mirror, the active region being in electrical contact with the first metal contact and generating a light reflected between the first mirror and a second mirror;
   a ground plane partially surrounding the two or more VCSEL devices;
   an electrical waveguide;
   one or more raised areas including a second metal contact electrically connected to the common electrical contact and to the electrical waveguide; and
   a metal structure deposited over one or more of the two or more VCSEL devices, electrically connected to the first metal contact, electrically isolated from the common electrical contact, and in contact with the electrical waveguide.

2. The high frequency VCSEL array device as recited in claim 1, wherein the metal structure is a heat sink.

3. The high frequency VCSEL array device as recited in claim 2, wherein the second metal contact is electrically connected to the ground plane without wire bonding.

4. The high frequency VCSEL array device as recited in claim 1, wherein the two or more VCSEL devices further include a containment region reducing capacitance within the first mesa.

5. The high frequency VCSEL array device as recited in claim 1, further comprising a set of lenses positioned over the two or more VCSEL devices.

6. The high frequency VCSEL array device as recited in claim 5, wherein each lens in the set of lenses is positioned over each VCSEL device of the two or more VCSEL devices by an offset distance necessary to direct the light to one or more locations.

7. The high frequency VCSEL array device as recited in claim 1, wherein the high frequency VCSEL array device is used as an emitter for data communication.

8. The high frequency VCSEL array device as recited in claim 7, wherein the data communication occurs within an optical fiber.

9. The high frequency VCSEL array device as recited in claim 7, wherein the data communication occurs within an optical free space.

10. The high frequency VCSEL array device as recited in claim 1, wherein the high frequency VCSEL array device is used as a short pulse emitter for material processing.

11. The high frequency VCSEL array device as recited in claim 1, wherein the high frequency VCSEL array device is used as a short pulse emitter for an optical pump.

12. The high frequency VCSEL array device as recited in claim 1, wherein the high frequency VCSEL array device is used as a pulsed emitter for laser detection and ranging.

13. The high frequency VCSEL array device as recited in claim 1, wherein the high frequency VCSEL array device is used as a pulsed emitter for light detection and ranging.

14. The high frequency VCSEL array device as recited in claim 1, wherein the high frequency VCSEL array device is used in a beam steering device.

15. The high frequency VCSEL array device as recited in claim 1, wherein the high frequency VCSEL array device is used in an illuminating device for imaging applications.

16. A high frequency VCSEL array device, comprising: two or more raised VCSEL devices on a common electrical contact and connected in parallel, each of the two or more raised VCSEL devices including an active region positioned between a first mirror and a second mirror, the active region generating a pulsed or modulated light with a frequency component of at least 1 GHz, the pulsed or modulated light being reflected between the first mirror and the second mirror, the two or more raised VCSEL devices having an optical power of at least 30 mW, each raised VCSEL device forming a first mesa on the common electrical contact, each first mesa including a dielectric layer positioned on a sidewall of each first mesa and in contact with the common electrical contact, the first mirror, a first metal contact, and the active region positioned between the first metal contact and the first mirror;

a ground plane partially surrounding the two or more VCSEL devices;

one or more raised inactive regions connected to the common electrical contact; and an electrical waveguide in contact with the two or more raised VCSEL devices and the one or more raised inactive regions such that the two or more raised VCSEL devices and the one or more raised inactive regions are positioned between the electrical waveguide and the common electrical contact.

17. The high frequency VCSEL array device as recited in claim 16, further comprising a set of lenses positioned over the two or more raised VCSEL devices.

18. The high frequency VCSEL array device as recited in claim 17, wherein each lens in the set of lenses is positioned over each raised VCSEL device of the two or more raised VCSEL devices by an offset distance necessary to direct the light to one or more locations.

19. The high frequency VCSEL array device as recited in claim 16, wherein the high frequency VCSEL array device is used as an emitter for data communication.

20. The high frequency VCSEL array device as recited in claim 19, wherein the data communication occurs within an optical fiber.

21. The high frequency VCSEL array device as recited in claim 19, wherein the data communication occurs within an optical free space.

22. The high frequency VCSEL array device as recited in claim 16, wherein the high frequency VCSEL array device is used as a short pulse emitter for material processing.

23. The high frequency VCSEL array device as recited in claim 16, wherein the high frequency VCSEL array device is used as a short pulse emitter for an optical pump.

24. The high frequency VCSEL array device as recited in claim 16, wherein the high frequency VCSEL array device is used as a pulsed emitter for laser detection and ranging.

25. The high frequency VCSEL array device as recited in claim 16, wherein the high frequency VCSEL array device is used as a pulsed emitter for light detection and ranging.

26. The high frequency VCSEL array device as recited in claim 16, wherein the high frequency VCSEL array device is used in a beam steering device.

27. The high frequency VCSEL array device as recited in claim 16, wherein the high frequency VCSEL array device is used in an illuminating device for imaging applications.

28. A high frequency VCSEL array device, comprising:

two or more VCSEL devices sharing a common electrical contact and connected in parallel, each VCSEL device among the two or more VCSEL devices forming a first mesa on the common electrical contact, each first mesa including a first side in contact with the common electrical contact, a first mirror, a first metal contact, a containment region produced by a metal layer encasing the first mesa reducing capacitance within the first mesa, and an active region positioned between the first metal contact and the first mirror, the active region being in electrical contact with the first metal contact and generating a pulsed or modulated light with a frequency component of at least 1 GHz being reflected between the first mirror and a second mirror, the two or more raised VCSEL devices having an optical power of at least 30 mW;

a ground plane partially surrounding the two or more VCSEL devices;

an electrical waveguide;

one or more raised areas including a second metal contact electrically connected to the common electrical contact and to the electrical waveguide.

* * * * *